(12) United States Patent
Sun et al.

(10) Patent No.: US 8,455,807 B2
(45) Date of Patent: Jun. 4, 2013

(54) SUNLIGHT COLLECTOR MODULE HAVING A LIGHT-GUIDE ELEMENT AND A BEAM SPLITTING ELEMENT AND A HYBRID ILLUMINATION SYSTEM HAVING THE SAME

(75) Inventors: Wen-Hsin Sun, Jhongli (TW); Chih-Hsuan Tsuei, Jhongli (TW)

(73) Assignee: National Central University, Taoyuan County (TW)

( * ) Notice: Subject to any disclaimer, the term of this patent is extended or adjusted under 35 U.S.C. 154(b) by 324 days.

(21) Appl. No.: 13/048,308

(22) Filed: Mar. 15, 2011

(65) Prior Publication Data
US 2011/0226311 A1 Sep. 22, 2011

(30) Foreign Application Priority Data
Mar. 15, 2010 (TW) ................................ 99107566 A (51) Int. Cl.
*G01C 21/02* (2006.01)
(52) U.S. Cl.
USPC ...................................... 250/203.4; 250/239
(58) Field of Classification Search
USPC ................ 250/203.4, 203.1, 203.3, 205, 239, 250/216; 126/686–694; 136/244–259
See application file for complete search history.

(56) References Cited

U.S. PATENT DOCUMENTS
4,746,370 A * 5/1988 Woolf ........................... 136/246

FOREIGN PATENT DOCUMENTS
TW  M333656  6/2008
TW  M370800  12/2009

* cited by examiner

*Primary Examiner* — Que T Le
(74) *Attorney, Agent, or Firm* — Muncy, Geissler, Olds & Lowe, PLLC (57) ABSTRACT

A sunlight collector module is disclosed, capable of collecting the sunlight from the sun for the illumination at a certain position, and of reflecting portion of the sunlight to a solar photovoltaic module. The disclosed sunlight collector module comprises: a base, a first reflective element disposed on the base, a second reflective element, a light-guide element, and a beam splitting element, wherein the second reflective element is disposed on a side, which is opposite to the base, of the first reflective element. Besides, the light-guide element disposed on a side, which is opposite to the second reflective element, of the first reflective element. In addition, the beam splitting element is disposed between the first reflective element and the light-guide element, for reflecting portion of the sunlight to the solar photovoltaic module. The non-reflected portion of the sunlight passes through the beam splitting element and enters the light-guide element.

12 Claims, 7 Drawing Sheets

SUNLIGHT COLLECTOR MODULE HAVING A LIGHT-GUIDE ELEMENT AND A BEAM SPLITTING ELEMENT AND A HYBRID ILLUMINATION SYSTEM HAVING THE SAME

CROSS REFERENCE TO RELATED APPLICATION

This application claims the benefits of the Taiwan Patent Application Serial Number 99107566, filed on Mar. 16, 2010, the subject matter of which is incorporated herein by reference.

BACKGROUND OF THE INVENTION

1. Field of the Invention

The present invention relates to sunlight collector module and, more particularly, to a sunlight collector module capable of collecting the sunlight from the sun for the illumination at a certain position, and of reflecting portion of the sunlight to a solar photovoltaic module for generating electric power. Besides, the present invention also related to a hybrid illumination system, which is capable of illuminating a certain position at an illuminance value in a pre-determined range, by means of integrating the sunlight collected by a sunlight collector module thereof and the light emitted from plural light emitting units of the light box thereof.

2. Description of Related Art

Figure 1:
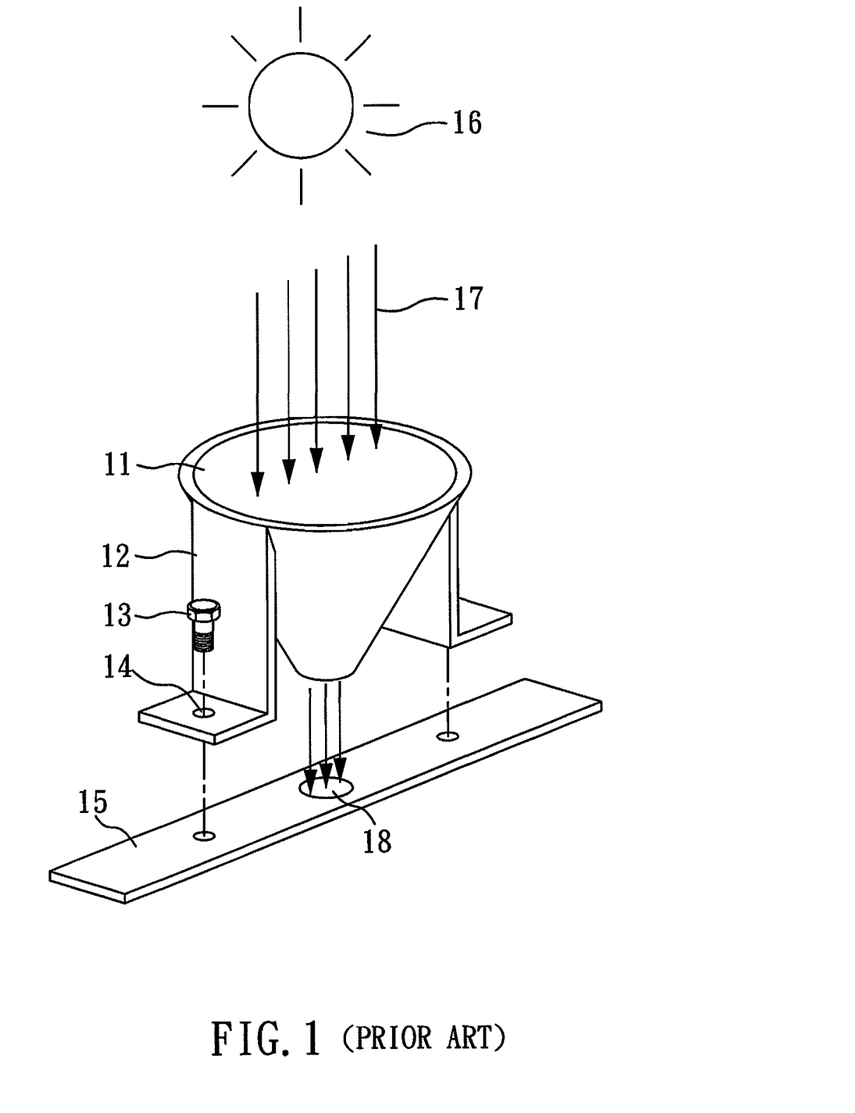
FIG. 1 is a perspective view of a conventional sunlight collector structure.

A conventional sunlight illumination system, as the one disclosed in the Taiwan Patent Publication No. M333656, has a sunlight collector structure. As shown in FIG. 1, the sunlight collector structure includes a reflection surface 11, a supporting structure 12, plural fixing screws 13, plural screw holes 14, and a base 15. As the sun is extremely far away from the sunlight collector structure, the sunlight from the sun 16 is almost a parallel light 17 when it reached the reflection surface 11. After the sunlight reaches the reflection surface 11, the sunlight is multiple-reflected by the reflection surface 11, until it reaches a concentrating position 18 below the reflection surface 11. For improving the stability of the sunlight collector structure, the supporting structure 12 supporting the reflection surface 11 is fixed to the base 15, by means of screwing the plural fixing screws 13 respectively into the corresponding screw holes 14.

Figure 2:
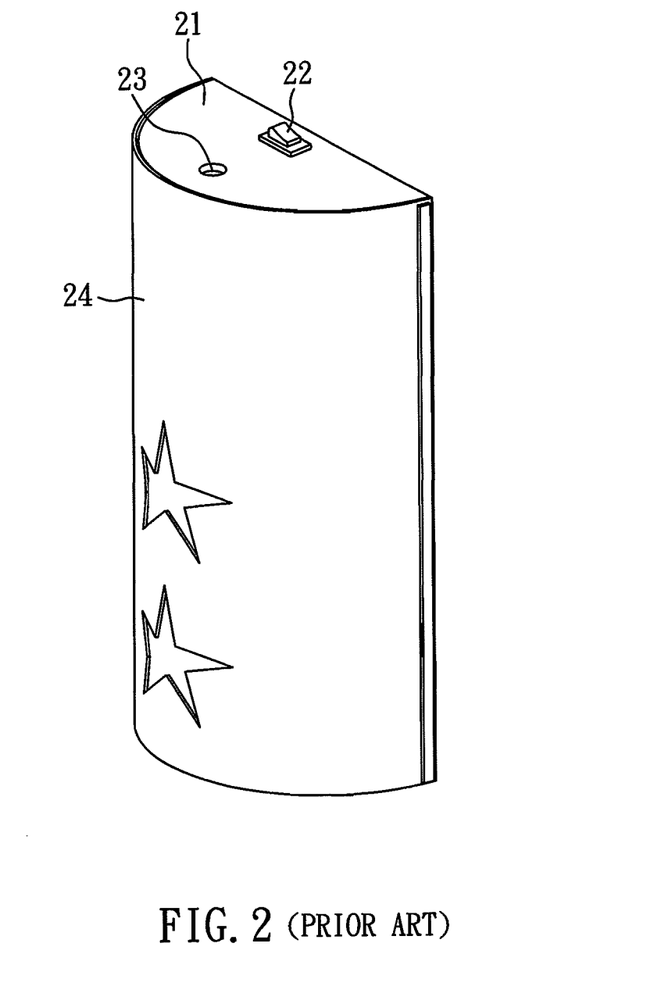
FIG. 2 is a perspective view of a conventional light box.

In addition, a conventional light box illumination system, as the one disclosed in the Taiwan Patent Publication No. M370800, includes a light box 21, a switch 22, a heat dissipation hole 23, and a diffuser plate 24, as shown in FIG. 2. Once the light is provided by the light source (not shown in the figure) inside the light box 21, the light is multiple-reflected inside the interior space of the light box 21. At last, some of the multi-reflected light is emitted through the differ plate 24, to the exterior.

However, the sunlight collection efficiency of the sunlight collector structure of the conventional sunlight illumination system, as the one shown in FIG. 1, and the diffusion ability of the light box of the conventional light box illumination system, as the one shown in FIG. 2, are both limited. Since, during the multi-reflection of the sunlight by the reflection surface 11, some of the sunlight will be reflected to a place outside the reflection surface 11, resulting in the lost of that light. In addition, the light provided by the light source (not shown in the figure) inside the light box 21 is also multiple-reflected inside the interior space of the light box, before being emitted to the exterior. Further, as none of any kind of high-reflectively coating has been coated on the surrounding wall of the light box 21, the intensity of the light is decreased significantly, after each of the multiple-reflection inside the light box 21.

As a result, the combination of the conventional sunlight illumination system and the conventional light box illumination system cannot provide acceptable efficiency, in the application of an indoor illumination. Moreover, due to the significant loss of light intensity in the conventional light box, a light source capable of providing a large light intensity must be installed in the conventional light box, such as a conventional bulb or a conventional fluorescent tube, which consumes a lot of electric power during its operation. Thus, the power assumption of the conventional light box illumination system is significantly large, which is not favorable to the green power trend having been popular in the world.

Therefore, a sunlight collector module capable of collecting the sunlight from the sun for the illumination at a certain position and of reflecting portion of the sunlight to a solar photovoltaic module for generating electric power is required by the industry. In addition, a hybrid illumination system capable of illuminating a certain position at an illuminance value in a pre-determined range by means of integrating the sunlight collected by a sunlight collector module thereof and the light emitted from the plural light emitting units of the light box thereof is also required by the industry.

SUMMARY OF THE INVENTION

The object of the present invention is to provide a sunlight collector module, capable of collecting the sunlight from the sun for the illumination at a certain position, and of reflecting portion of the sunlight to a solar photovoltaic module for generating electric power.

The object of the present invention is to provide a hybrid illumination system, capable of illuminating a certain position at an illuminance value in a pre-determined range, by means of integrating the sunlight collected by a sunlight collector module thereof and the light emitted from plural light emitting units of the light box thereof.

To achieve the object, the sunlight collector module of the present invention comprises: a base; a first reflective element disposed on the base; a second reflective element disposed on a side, which is opposite to the base, of the first reflective element; while a reflection surface of the second reflective element is opposing to a reflection surface of the first reflective element; a light-guide element disposed on a side, which is opposite to the second reflective element, of the first reflective element; and a beam splitting element disposed between the first reflective element and the light-guide element; wherein a sunlight from the sun is sequentially reflected by the reflection surface of the first reflective element and the reflection surface of the second reflective element, then, passed through the beam splitting element and arrived the light-guide element; the beam splitting element reflects portion of the sunlight passed through, having the wavelength in a pre-determined wavelength range, to the solar photovoltaic module; the light-guide elements guides the light entered therein to a pre-determined position, for the illumination use.

To achieve the object, the hybrid illumination system of the present invention comprises: a sunlight collector module including a base, a first reflective element, a second reflective element, a light-guide element, and a beam splitting element, wherein the first reflective element disposed on the base; the second reflective element disposed on a side, which is opposite to the base, of the first reflective element; while a reflection surface of the second reflective element is opposing to a reflection surface of the first reflective element; the light-guide element disposed on a side, which is opposite to the second reflective element, of the first reflective element; the a beam splitting element disposed between the first reflective element and the light-guide element; a light box including a surrounding wall, a light sensing unit, plural light emitting units and a light output surface, wherein the surrounding wall and the light output surface enclose the light sensing unit and the plural light emitting units therein; the plural light emitting units are disposed on the surrounding wall and emitting light to the interior space of the light box; and a control module coupled with the light sensing unit and the plural light emitting units; wherein a sunlight from the sun is sequentially reflected by the reflection surface of the first reflective element and the reflection surface of the second reflective element, then, passed through the beam splitting element and arrived the light-guide element; the beam splitting element reflects portion of the sunlight passed through, having the wavelength in a pre-determined wavelength range, to the solar photovoltaic module; the light-guide elements guides the light entered therein to the light box; the light sensing unit senses the illuminance of the interior space of the light box and obtains an illuminance value; the control module controls the light emitting of the plural light emitting units based on the illuminance value, for maintaining the illuminance value of the light output from the light output surface, in a pre-determined range.

Therefore, by including the beam splitting element capable of reflecting portion of the sunlight passed through, having the wavelength in a pre-determined wavelength range, to the solar photovoltaic module, the sunlight collector module of the present invention can reflect portion of the sunlight to the solar photovoltaic module for generating electric power, and collect the sunlight of from the sun to illuminate a certain position, through the light-guide element thereof. Moreover, by having the light box having a light sensing unit and plural light emitting units, and the control module coupled with them, the hybrid illumination system of the present invention can illuminate a certain position at an illuminance value in a pre-determined range, by mean of integrating the sunlight collected by a sunlight collector module thereof and the light emitted from plural light emitting units of the light box thereof.

Other objects, advantages, and novel features of the invention will become more apparent from the following detailed description when taken in conjunction with the accompanying drawings.

DETAILED DESCRIPTION OF THE PREFERRED EMBODIMENT

Figure 3:
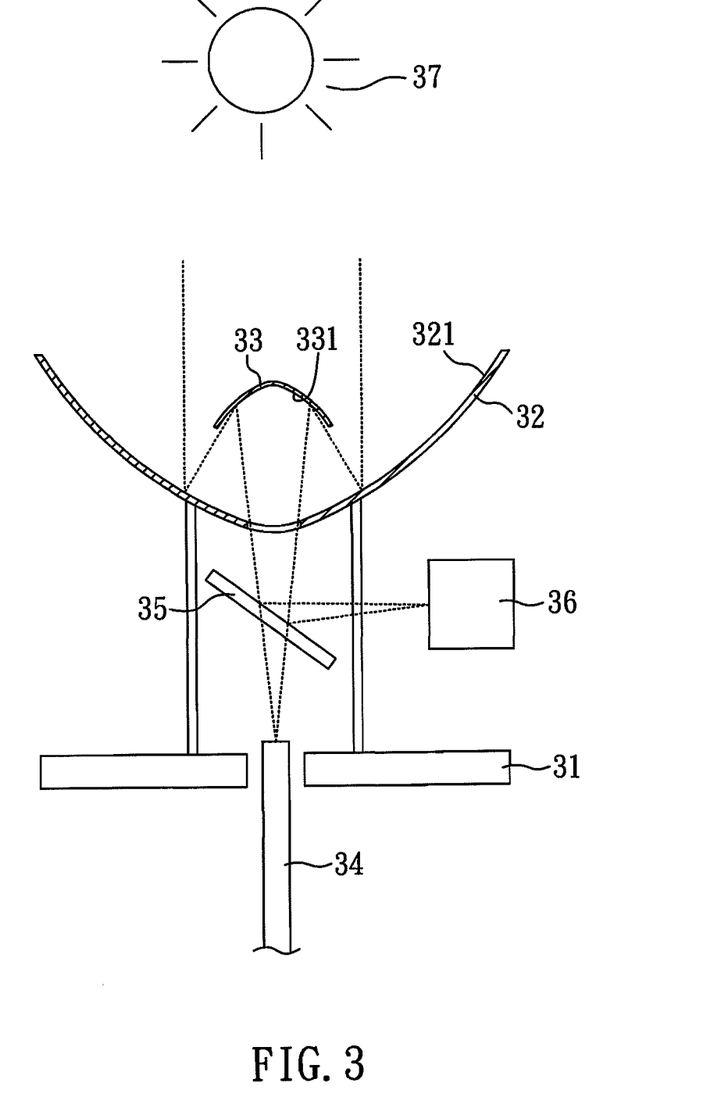
FIG. 3 is a perspective view of the sunlight collector module according to a first embodiment of the present invention.

As shown in FIG. 3, the sunlight collector module according to a first embodiment of the present invention, which is in cooperated with a solar photovoltaic module, comprises: a base 31, a first reflective element 32, a second reflective element 33, a light-guide element 34, and a beam splitting element 35, wherein the first reflective element 32 is disposed on the base 31, and the second reflective element 33 is disposed on a side, which is opposite to the base 31, of the first reflective element 32. In the present embodiment, the second reflective element 33 is disposed on the upper side of the first reflective element 32, while the base 31 is disposed on the lower side of the first reflective element 32.

Besides, the second reflective element 33 has a reflection surface 331, while the first reflective element 32 has a reflection surface 321. In addition, in the configuration shown in the figure, the reflection surface 331 of the second reflective element 33 is opposing to the reflection surface 321 of the first reflective element 32. Furthermore, in the present embodiment, the first reflective element 32 is a parabolic reflector, while the second reflective element is an ellipsoidal reflector. As shown in FIG. 3, the light-guide element 34 is disposed on a side, which is opposite to the second reflective element 33, of the first reflective element 32. In the present embodiment, the light-guide element 34 is disposed on the lower side of the first reflective element 32, while the second reflective element 33 is disposed on the upper side of the first reflective element 32. Besides, the beam splitting element 35 is disposed between the first reflective element 32 and the light-guide element 34, for modulating the characteristic of the light passing through it.

As described above, the sunlight collector module according to a first embodiment of the present invention is in cooperated with a solar photovoltaic module 36, which can generate electric power while it is irradiated by portion of the sunlight collected by the sunlight collector module according to a first embodiment of the present invention. In the present embodiment, the solar photovoltaic module 36 is a concentrated photovoltaic module, which is also known as CPV module.

While the sunlight collector module according to a first embodiment of the present invention is operating, the attitude of the sunlight collector module is continuously adjusted by a sun tracking system (not shown in the figure), which can track the position of the sun in real-time. Thus, the sunlight from the sun 37 is reflected by the reflection surface 321 of the first reflective element 32 and the reflection surface 331 of the second reflective element 33 in sequence. In the present embodiment, the first reflective element 32 and the second reflective element 33 form a so-called Cassegrain structure. In addition, the reflection surface 321 of the first reflective element 32 and the reflection surface 331 of the second reflective element 331 are in a con-focus configuration. That is, the focal point (not shown in the figure) of the reflection surface 321 of the first reflective element 32 coincides with the focal point (not shown in the figure) of the reflection surface 331 of the second reflective element 331.

After the sunlight is reflected by the reflection surface 331 of the second reflective element 331, the sunlight passed through the beam splitting element 35 and arrived the light-guide element 34. As shown in the figure, portion of the sunlight is reflected by the beam splitting element 35, to the solar photovoltaic module 36; wherein the portion of the sunlight being reflected has the wavelength in a pre-determined wavelength range. In the present embodiment, the beam splitting element 35 reflects the infrared portion of the sunlight to the solar photovoltaic module 36. However, in other application circumstances, such as in the application circumstance that a different kind of the solar photovoltaic module 36 being applied, the beam splitting element 35 can reflect the ultraviolet portion of the sunlight to the solar photovoltaic module 36.

It should be noticed that, the pass-band (the wavelength range of the light that can pass directly through the beams splitter) and the stop-band (the wavelength range of the light that cannot pass directly through the beams splitter, which may be reflected to a different angular position, for example a position having a 90 degrees angle difference to the original incident direction, by the beam splitter) of the beam-splitter are all designable, they can be designated to meet the specific needs of the user. Thus, in some application circumstances, the ultraviolet portion of the sunlight can be filtered (or absorbed) by the beam splitting element 35, while the infrared portion of the sunlight being reflected by the beam splitting element 35, to the solar photovoltaic module 36.

After passing the through beam splitting element 35, the sunlight not being reflected by the beam splitting element 35 is arrived the light-guide element 34, wherein the light-guide elements 34 guides the light entered therein to a pre-determined position, such as a light box, for the illumination use. In the present embodiment, the light-guide element 34 is a light-guide tube or an optical fiber, which can let the light to be transmitted therein, after entering the incident surface thereof.

Therefore, the sunlight collector module according to a first embodiment of the present invention can collect the sunlight from the sun, then guide the collected sunlight to a certain position, such as an office, for the illumination use. Besides, the portion of the sunlight, for example, the infrared portion of the sunlight, is reflected to a solar photovoltaic module for generating electric power.

Figure 4A:
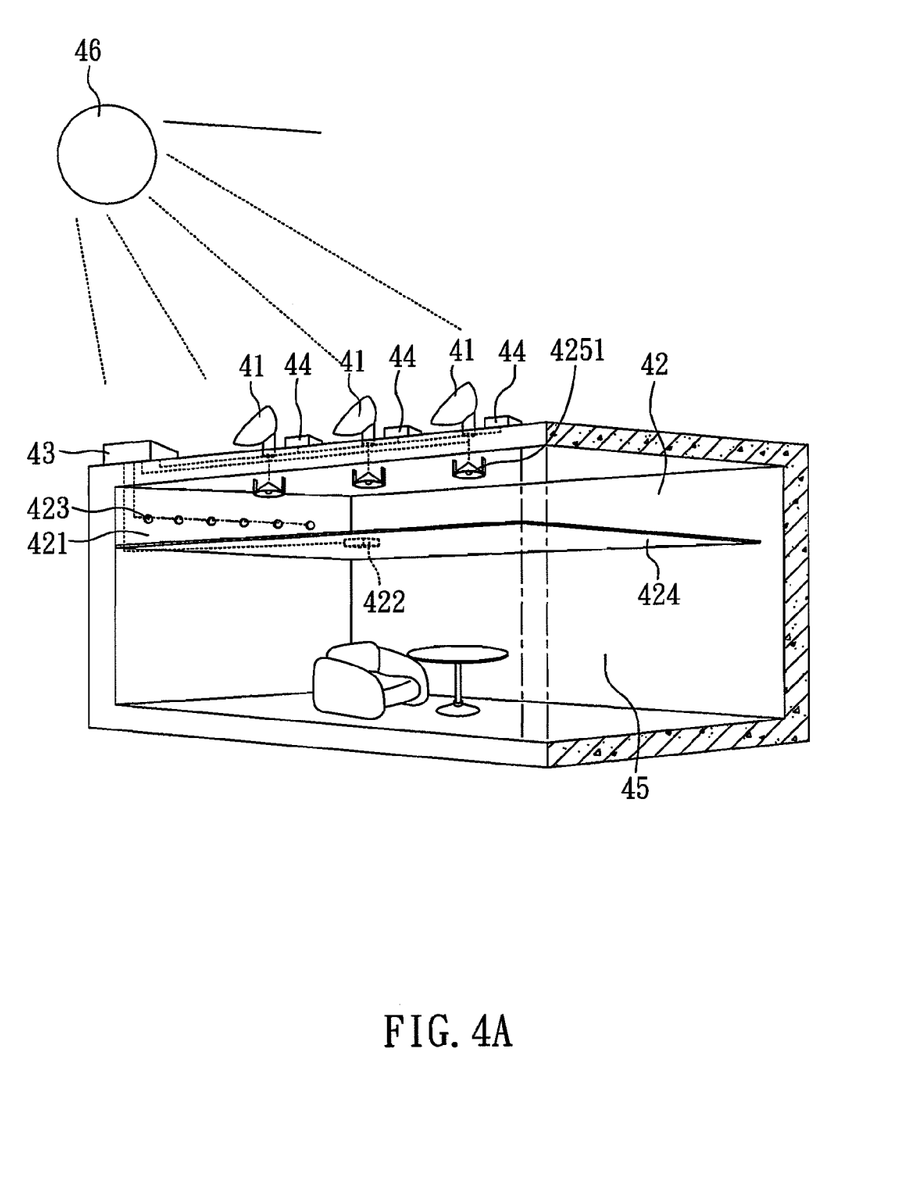
FIG. 4A is a perspective view of the hybrid illumination system according to a second embodiment of the present invention.

As shown in FIG. 4A, the hybrid illumination system according to a second embodiment of the present invention, which is in cooperated with a solar photovoltaic module, comprises: a sunlight collector module 41, a light box 42, and a control module 43, wherein the control module 43 is used for maintaining the illuminance value of the light emitted from the light box 42 in a pre-determined range.

Figure 4B:
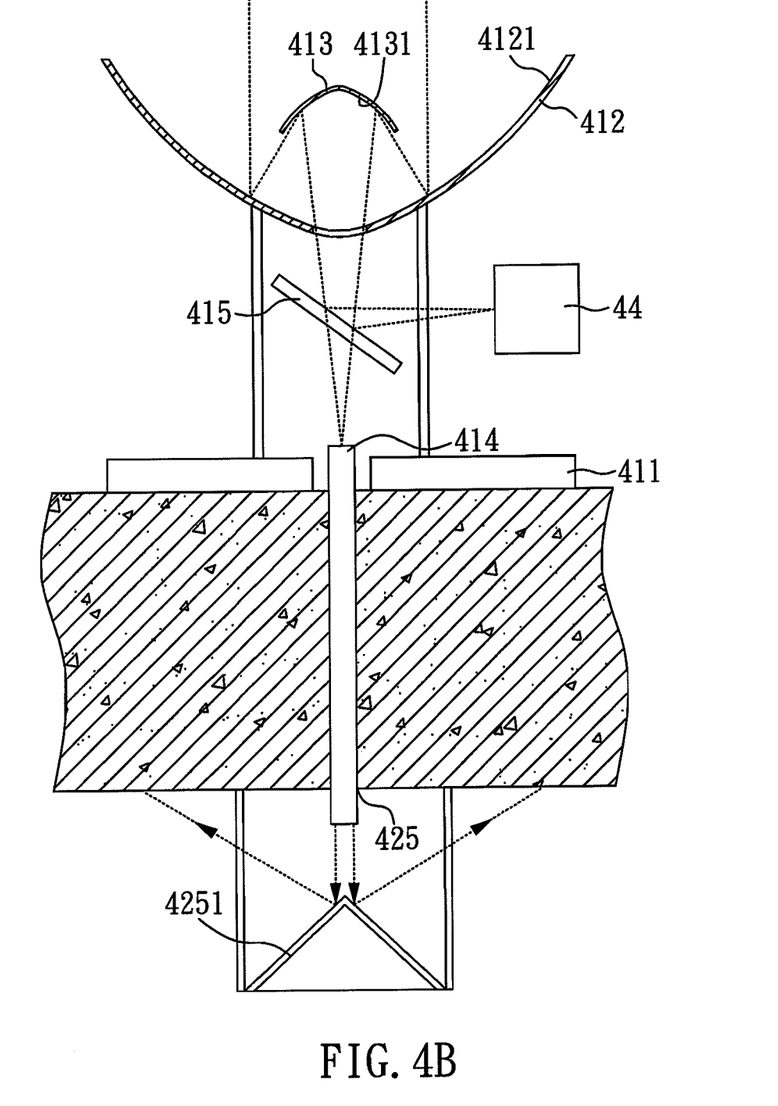
FIG. 4B is a perspective view of the sunlight collector module of the hybrid illumination system according to a second embodiment of the present invention.

Besides, as shown in FIG. 4B, the sunlight collector module 41 comprises a base 411, a first reflective element 412, a second reflective element 413, a light-guide element 414, and a beam splitting element 415, wherein the first reflective element 412 is disposed on the base 411, and the second reflective element 413 is disposed on a side, which is opposite to the base 411, of the first reflective element 412. In the present embodiment, the second reflective element 413 is disposed on the upper side of the first reflective element 412, while the base 411 is disposed on the lower side of the first reflective element 412. In addition, the second reflective element 413 has a reflection surface 4131, while the first reflective element 412 has a reflection surface 4121. Furthermore, in the configuration shown in the figure, the reflection surface 4131 of the second reflective element 413 is opposing to the reflection surface 4121 of the first reflective element 412. In the present embodiment, the first reflective element 412 is a parabolic reflector, while the second reflective element is an ellipsoidal reflector.

With reference to FIG. 4B again, the light-guide element 414 is disposed on a side, which is opposite to the second reflective element 413, of the first reflective element 412. In the present embodiment, the light-guide element 414 is disposed on the lower side of the first reflective element 412, while the second reflective element 413 is disposed on the upper side of the first reflective element 412. Besides, the beam splitting element 415 is disposed between the first reflective element 412 and the light-guide element 414, for modulating the characteristic of the light passing through it.

Return to FIG. 4A, the light box 42 includes a surrounding wall 421, a light sensing unit 422, plural light emitting units 423 and a light output surface 424, wherein the surrounding wall 421 and the light output surface 424 enclose the light sensing unit 422 and the plural light emitting units 423 therein. Besides, the plural light emitting units 423 are disposed on the surrounding wall 421 and emitting light to the interior space of the light box 42. In the present embodiment, the surrounding wall 421 of the light box 42 is coated with a barium sulfate coating, a silver reflection layer or an aluminum mirror, for causing the multiple reflecting phenomena of the light transmitting at the interior space of the light box 42. In addition, the light box 42 has a diffuser film or diffuser plate, depending on the size of the light box 42, at the light output surface 424 thereof, in order to further average the light intensity distribution of the light output from the light box 42.

Moreover, in the present embodiment, the light sensing unit 422 of the light box 42 is used to sense the illuminance of the interior space of the light box 42 and obtains an illuminance value. Besides, in the present embodiment, the light sensing unit 422 is one or more than one photodiodes, disposed at the interior space of the light box 42. In addition, the plural light emitting units 423 are plural white-light LEDs, for emitting white light when it is necessary.

At final, the control module 43 is coupled with the light sensing unit 422 and the plural light emitting units 423, for maintaining the illuminance value of the light output from the light output surface 424, in a pre-determined range. For example, in the range between 500 lux and 750 lux. In the present embodiment, the control module 43 is a micro-processing unit (MPU) or any kind of available processor. With reference to FIG. 4A again, the light box 42 of the hybrid illumination system according to a second embodiment of the present invention is installed on the ceiling of an indoor space, such as an office 45, for illuminating the office 45 with the illuminance in the previously mentioned range. Besides, the sunlight collector module 41, in the present embodiment, 3 of them, is installed right on top of the office 45. Thus, the sunlight collected by these sunlight collector modules 41 can be guided directly to the 3 sunlight outputs 425 of the light box 42. In addition, plural conical reflector 4251 is installed on the ceiling of the office 45, each of them corresponds to one of those sunlight outputs 425.

While the hybrid illumination system according to a second embodiment of the present invention is operating, the attitude of the sunlight collector module 41 is continuously adjusted by a sun tracking system (not shown in the figure), which can track the position of the sun in real-time. Thus, the sunlight from the sun 46 can be continuously collected by the sunlight collector module 41, in the manner described below:

The sunlight is reflected by the reflection surface 4121 of the first reflective element 412 and the reflection surface 4131 of the second reflective element 413 in sequence. While, in the present embodiment, the first reflective element 412 and the second reflective element 413 form a so-called Cassegrain structure. In addition, the reflection surface 4121 of the first reflective element 412 and the reflection surface 4131 of the second reflective element 4131 are in a con-focus configuration. That is, the focal point (not shown in the figure) of the reflection surface 4121 of the first reflective element 412 coincides with the focal point (not shown in the figure) of the reflection surface 4131 of the second reflective element 4131.

Then, after the sunlight is reflected by the reflection surface 4131 of the second reflective element 4131, the sunlight passed through the beam splitting element 415 and arrived the light-guide element 414, while portion of the sunlight is reflected by the beam splitting element 415, to the solar photovoltaic module 44. The portion of the sunlight being reflected has the wavelength in a pre-determined wavelength range. For example, in the present embodiment, the beam splitting element 415 reflects the infrared portion of the sunlight to the solar photovoltaic module 44, for generating electric power. In addition, the solar photovoltaic module 44 applied in the present embodiment is a concentrated photovoltaic module, which is also known as CPV module, having a higher efficiency than the conventional PV module.

After passing the through beam splitting element 415, the sunlight not being reflected by the beam splitting element 415 is arrived the light-guide element 414, wherein the light-guide elements 414 guides the light entered therein to a predetermined position, which is the light box 42. In the present embodiment, the light-guide element 414 is a light-guide tube or an optical fiber, which can let the light to be transmitted therein, after entering the incident surface thereof. At this stage, the sunlight from the sun 46 has been collected by the sunlight collector module 41, while portion of the sunlight has been provided to the solar photovoltaic module 44 for generating electric power.

Then, the light transmitted in the light-guide element 414 is guided to enter the light box 42, for illuminating the interior space of the light box 42. At this time, the aforementioned light sensing unit 422 senses the illuminance of the interior space of the light box 42 and obtains the illuminance value, wherein the illuminance value is further transmitted to the control module 43. The control module 43 then controls the light emitting of the plural light emitting units 423 based on the illuminance value, for maintaining the illuminance value of the light output from the light output surface 424, in a pre-determined range. In addition, the control module 43 is further coupled to the solar photovoltaic module 44, for obtaining the required electric power for operation.

The control rule, which the control module 43 employs during the operation of the hybrid illumination system according to a second embodiment of the present invention, is as follow:
1. Determining the target value of the illuminance value, for example, between 500 lux and 750 lux;
2. Comparing the illuminance value obtained from the light sensing unit 422 with the target value;
3. When the illuminance value obtained from the light sensing unit 422 is smaller than the target value, turn on the plural light emitting units 423 for emitting light; and
4. When the illuminance value obtained from the light sensing unit 422 is larger than the target value, and the plural light emitting units 423 has been turned on, turn off the plural light emitting units 423.

Moreover, in some advance cases, the control module 43 can control the number of the plural light emitting units 423 to be turned on, depending on the difference between the illuminance value obtained from the light sensing unit 422 and the target value, for maintaining the illuminance value of the light output from the light output surface 424 in a pre-determined range. For example, when the difference is large, such as in a cloudy day, the control module 43 may turn on all of the plural light emitting units 423. On the other hand, when the difference is small, such as in a partly cloudy day, the control module 43 may turn on only some of the plural light emitting units 423.

An experimental example is provided below, which provides the support to the applicability of the hybrid illumination system according to a second embodiment of the present invention.

First of all, the experiment was conducted at an office of one of the building in the National Central University, Taoyuan county, Taiwan, on the date of Oct. 29, 2009. The hybrid illumination system in this example included 6 sunlight collector modules, and the size of the light box was 8.8 m long, 2.94 m wide and 1.20 m high. Besides, the surrounding wall of the light box was coated with the barium sulfate coating having the reflectivity of 95%. In addition, 140 white-light LEDs were arranged on the surrounding wall of the light box.

Second, the measurement was taken from 8:00 a.m. to 6:00 p.m. of that day, on the one-hour basis.

The experiment result is summarized in the following Table 1:

TABLE 1

|   | Illuminance of Sunlight (lux) | [Only Sunlight] Average illuminance (lux) | [Sunlight and LEDs] Average illuminance (lux) |
|---|---|---|---|
| 8:00 a.m. | 105000 | 517.02 | 517.02 (Without LEDs) |
| 9:00 a.m. | 108000 | 531.60 | 531.60 (Without LEDs) |
| 10:00 a.m. | 110000 | 541.45 | 541.45 (Without LEDs) |
| 11:00 a.m. | 122000 | 600.52 | 600.52 (Without LEDs) |
| Noon | 130000 | 639.89 | 639.89 (Without LEDs) |
| 1:00 p.m. | 120000 | 590.67 | 590.67 (Without LEDs) |
| 2:00 p.m. | 108000 | 531.60 | 531.60 (Without LEDs) |
| 3:00 p.m. | 104000 | 511.92 | 511.92 (Without LEDs) |
| 4:00 p.m. | 103000 | 506.99 | 506.99 (Without LEDs) |
| 5:00 p.m. | 60000 | 295.33 | 533.85 (66 LEDs) |
| 6:00 p.m. | 36000 | 177.20 | 539.55 (100 LEDs) |
| 7:00 p.m. | 55 | 0.27 | 505.13 (140 LEDs) |
| 8:00 p.m. | 0 | 0 | 509.69 (140 LEDs) |
| 9:00 p.m. | 0 | 0 | 509.69 (140 LEDs) |

Basing on the experiment result shown in Table 1, the electric power consumption during the office time, from 8:00 a.m. to 6:00 p.m., of the hybrid illumination system according to a second embodiment of the present invention is merely 0.93296 kW·hr, while the illuminance value of an office table in the office 45, which is 74 centimeters height above the ground, has been maintained in the range between 500 lux and 750 lux. Thus, the power consumption of the hybrid illumination system according to a second embodiment of the present invention is much less than that of any kind of conventional illumination system.

Therefore, the hybrid illumination system according to a second embodiment of the present invention can collect the sunlight from the sun, then guide the collected sunlight to a certain position, for illuminating the certain position at an illuminance value in a pre-determined range, by means of integrating the sunlight collected by a sunlight collector module thereof and the light emitted from the plural light emitting units of the light box thereof.

Figure 5A:
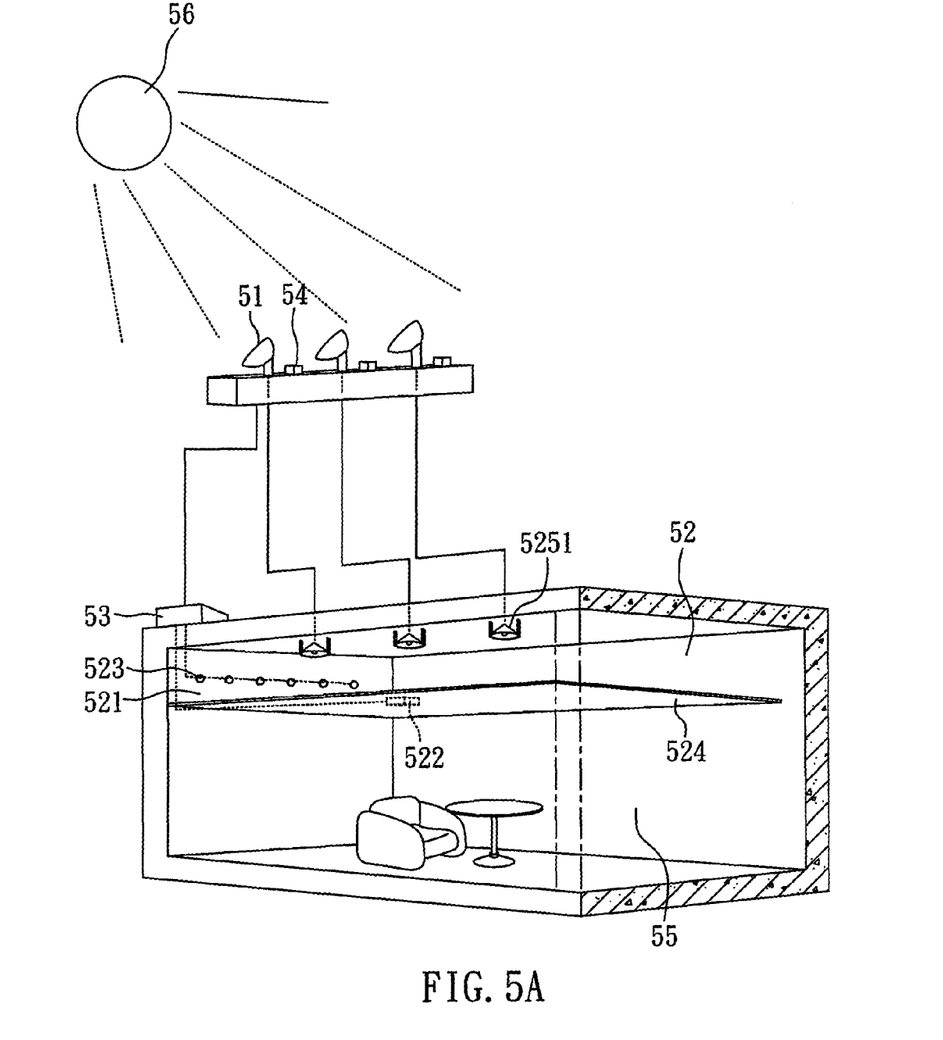
FIG. 5A is a perspective view of the hybrid illumination system according to a third embodiment of the present invention.

As shown in FIG. 5A, the hybrid illumination system according to a third embodiment of the present invention, which is in cooperated with a solar photovoltaic module, comprises: a sunlight collector module 51, a light box 52, and a control module 53, wherein the control module 53 is used for maintaining the illuminance value of the light emitted from the light box 52 in a pre-determined range.

Figure 5B:
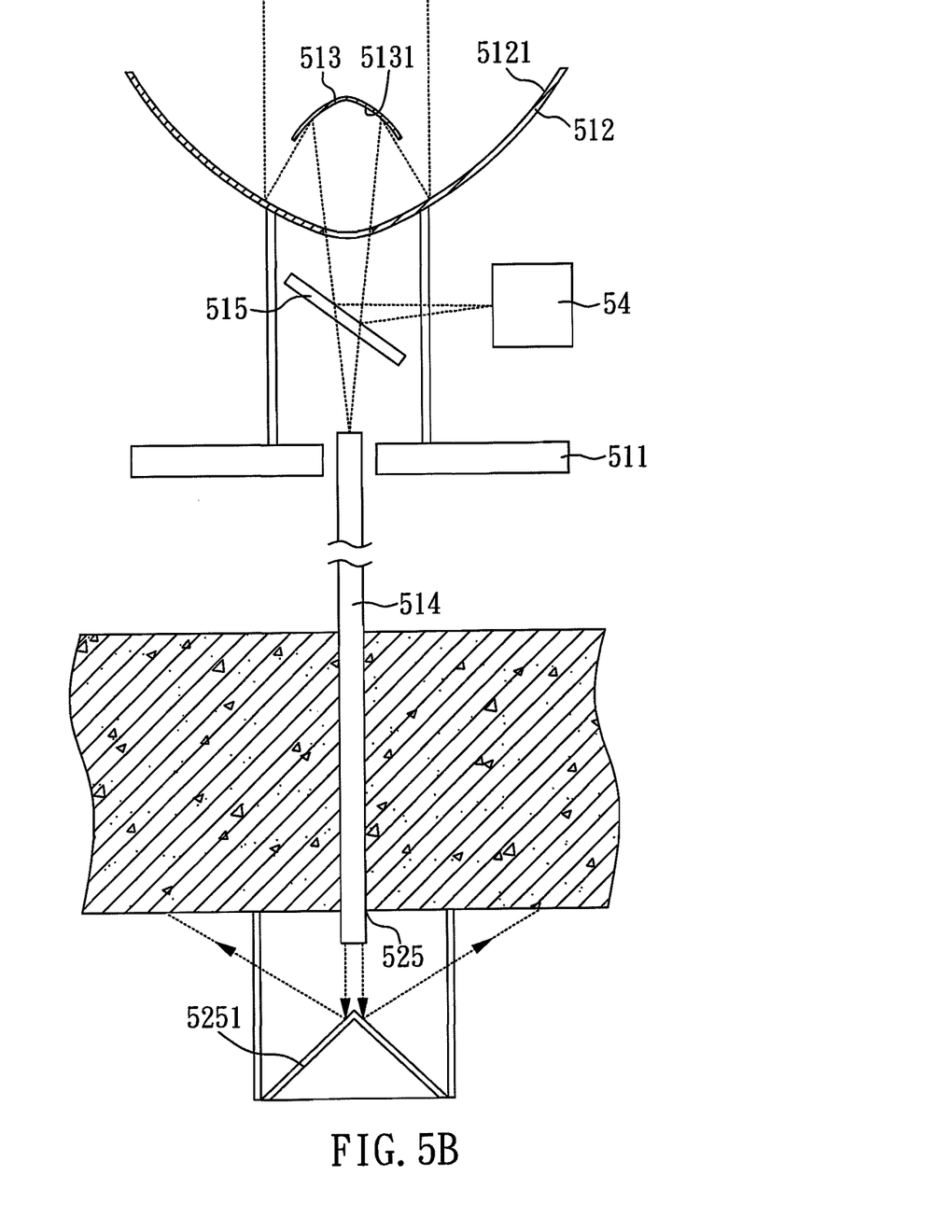
FIG. 5B is a perspective view of the sunlight collector module of the hybrid illumination system according to a third embodiment of the present invention.

Besides, as shown in FIG. 5B, the sunlight collector module 51 comprises a base 511, a first reflective element 512, a second reflective element 513, a light-guide element 514, and a beam splitting element 515, wherein the first reflective element 512 is disposed on the base 511, and the second reflective element 513 is disposed on a side, which is opposite to the base 511, of the first reflective element 512. In the present embodiment, the second reflective element 513 is disposed on the upper side of the first reflective element 512, while the base 511 is disposed on the lower side of the first reflective element 512. In addition, the second reflective element 513 has a reflection surface 5131, while the first reflective element 512 has a reflection surface 5121. Furthermore, in the configuration shown in the figure, the reflection surface 5131 of the second reflective element 513 is opposing to the reflection surface 5121 of the first reflective element 512. In the present embodiment, the first reflective element 512 is a parabolic reflector, while the second reflective element is an ellipsoidal reflector.

With reference to FIG. 5B again, the light-guide element 514 is disposed on a side, which is opposite to the second reflective element 513, of the first reflective element 512. In the present embodiment, the light-guide element 514 is disposed on the lower side of the first reflective element 512, while the second reflective element 513 is disposed on the upper side of the first reflective element 512. Besides, the beam splitting element 515 is disposed between the first reflective element 512 and the light-guide element 514, for modulating the characteristic of the light passing through it.

As described above, the hybrid illumination system according to a third embodiment of the present invention is in cooperated with a solar photovoltaic module 54, which can generate electric power while it is irradiated by portion of the sunlight collected by the sunlight collector module 51. In the present embodiment, the solar photovoltaic module 54 is a concentrated photovoltaic module, which is also known as CPV module.

Return to FIG. 5A, the light box 52 includes a surrounding wall 521, a light sensing unit 522, plural light emitting units 523 and a light output surface 524, wherein the surrounding wall 521 and the light output surface 524 enclose the light sensing unit 522 and the plural light emitting units 523 therein. Besides, the plural light emitting units 523 are disposed on the surrounding wall 521 and emitting light to the interior space of the light box 52. In the present embodiment, the surrounding wall 521 of the light box 52 is coated with a barium sulfate coating, a silver reflection layer or an aluminum mirror, for causing the multiple reflecting phenomena of the light transmitting at the interior space of the light box 52. In addition, the light box 52 has a diffuser film or diffuser plate, depending on the size of the light box 52, at the light output surface 524 thereof, in order to further average the light intensity distribution of the light output from the light box 52.

Moreover, in the present embodiment, the light sensing unit 522 of the light box 52 is used to sense the color temperature of the interior space of the light box 52 and obtains a color temperature value. Besides, in the present embodiment, the light sensing unit 522 is one or more than one photodiodes, disposed at the interior space of the light box 52. In addition, the plural light emitting units 523 of the light box 52 are plural single-color LEDs, such as red-light LEDs, green-light LEDs, blue-light LEDs, or white-light LEDs, for respectively emitting different color of light, when it is necessary.

At final, the control module 53 is coupled with the light sensing unit 522 and the plural light emitting units 523, for maintaining the color temperature value of the light output from the light output surface 524, in a pre-determined range. For example, in the range between 3000 k and 6500 k. In the present embodiment, the control module 53 is a micro-processing unit (MPU) or any kind of available processor.

As shown in FIG. 5A again, the light box 52 of the hybrid illumination system according to a third embodiment of the present invention is installed on the ceiling of an indoor space, such as an office 55, for illuminating the office 55 with the color temperature in the previously-mentioned range. Besides, the sunlight collector module 51, in the present embodiment, 3 of them, is installed on the roof of a building, where the office 55 is located in. Thus, the sunlight collected by these sunlight collector modules 51 is guided to the 3 sunlight outputs 525 of the light box 52, through a certain length of the light-guide element 514. In addition, plural conical reflector 5251 is installed on the ceiling of the office 55, each of them corresponds to one of those sunlight outputs 525.

As the operation of the hybrid illumination system according to a third embodiment of the present invention is similar to that of the hybrid illumination system according to a second embodiment of the present invention, except for the difference between the "illuminance value" and the "color temperature value" which the light sensing unit senses from the interior space of the light box, detailed description on the operation of the hybrid illumination system according to a third embodiment of the present invention will be omitted hereinafter.

However, the control rule, which the control module 53 employs during the operation of the hybrid illumination system according to a third embodiment of the present invention, is as follow:

1. Determining the target value of the color temperature value, for example, between 3000 k and 6500 k;
2. Comparing the color temperature value obtained from the light sensing unit 522 with the target value;
3. When the color temperature value obtained from the light sensing unit 522 is away from the target value, turn on some of or all of the plural light emitting units 523, having some of, or all of the RGB color, for emitting light having a certain color; and
4. When the color temperature value obtained from the light sensing unit 522 is close to the target value, turn off some of or all of the plural light emitting units 523, having some of, or all of the RGB color.

As a result, by means of emitting light of a certain color by some of, or all of the plural single-color LEDs of the light box thereof, the hybrid illumination system according to a third embodiment of the present invention can collect the sunlight from the sun, then guide the collected sunlight to a certain position, for illuminating the certain position at an color temperature value in a pre-determined range, by means of integrating the sunlight collected by a sunlight collector module thereof and the light emitted from the plural light emitting units of the light box thereof.

Although the present invention has been explained in relation to its preferred embodiment, it is to be understood that many other possible modifications and variations can be made without departing from the scope of the invention as hereinafter claimed.

What is claimed is:

1. A sunlight collector module, in cooperated with a solar photovoltaic module, comprising:
a base;
a first reflective element disposed on the base;
a second reflective element disposed on a side, which is opposite to the base, of the first reflective element; while a reflection surface of the second reflective element is opposing to a reflection surface of the first reflective element;

a light-guide element disposed on a side, which is opposite to the second reflective element, of the first reflective element; and a beam splitting element disposed between the first reflective element and the light-guide element;

wherein a sunlight from the sun is sequentially reflected by the reflection surface of the first reflective element and the reflection surface of the second reflective element, then, passed through the beam splitting element and arrived the light-guide element; the beam splitting element reflects portion of the sunlight passed through, having the wavelength in a pre-determined wavelength range, to the solar photovoltaic module; the light-guide element guides the light entered therein to a pre-determined position, for the illumination use.

2. The sunlight collector module as claimed in claim 1, wherein the first reflective element and the second reflective element form a Cassegrain structure, and the reflection surface of the first reflective element and the reflection surface of the second reflective element are in a con-focus configuration.

3. The sunlight collector module as claimed in claim 1, wherein the beam splitting element reflects the infrared portion of the sunlight to the solar photovoltaic module.

4. The sunlight collector module as claimed in claim 1, wherein the beam splitting element reflects the ultraviolet portion of the sunlight to the solar photovoltaic module.

5. The sunlight collector module as claimed in claim 1, wherein the light-guide element is a light-guide tube or an optical fiber.

6. A hybrid illumination system, in cooperated with a solar photovoltaic module, comprising:
a sunlight collector module including a base, a first reflective element, a second reflective element, a light-guide element, and a beam splitting element, wherein the first reflective element disposed on the base; the second reflective element disposed on a side, which is opposite to the base, of the first reflective element; while a reflection surface of the second reflective element is opposing to a reflection surface of the first reflective element; the light-guide element disposed on a side, which is opposite to the second reflective element, of the first reflective element; the beam splitting element disposed between the first reflective element and the light-guide element;
a light box including a surrounding wall, a light sensing unit, plural light emitting units and a light output surface, wherein the surrounding wall and the light output surface enclose the light sensing unit and the plural light emitting units therein; the plural light emitting units are disposed on the surrounding wall and emitting light to the interior space of the light box; and
a control module coupled with the light sensing unit and the plural light emitting units;
wherein a sunlight from the sun is sequentially reflected by the reflection surface of the first reflective element and the reflection surface of the second reflective element, then, passed through the beam splitting element and arrived the light-guide element; the beam splitting element reflects portion of the sunlight passed through, having the wavelength in a pre-determined wavelength range, to the solar photovoltaic module; the light-guide element guides the light entered therein to the light box; the light sensing unit senses the illuminance of the interior space of the light box and obtains an illuminance value; the control module controls the light emitting of the plural light emitting units based on the illuminance value, for maintaining the illuminance value of the light output from the light output surface, in a pre-determined range.

7. The hybrid illumination system as claimed in claim 6, wherein the beam splitting element reflects the infrared portion of the sunlight to the solar photovoltaic module.

8. The hybrid illumination system as claimed in claim 6, wherein light-guide element is a light-guide tube or an optical fiber.

9. The hybrid illumination system as claimed in claim 6, wherein the control module is coupled with the solar photovoltaic module, for obtaining the electric power for operation.

10. The hybrid illumination system as claimed in claim 6, wherein the surrounding wall of the light box is coated with a barium sulfate coating, a silver reflection layer or an aluminum mirror.

11. The hybrid illumination system as claimed in claim 6, wherein the plural light emitting units are plural white-light light emitting diodes.

12. The hybrid illumination system as claimed in claim 6, wherein the light sensing unit senses the color temperature of the interior space of the light box and obtains a color temperature value; the plural light emitting units are a plural single-color light emitting diodes; the control module controls the light emitting of the plural light emitting units based on the color temperature value, for maintaining the color temperature value of the light output from the light output surface, in a pre-determined range.

* * * * *